United States Patent [19]

Kudou et al.

[11] Patent Number: 5,359,212

[45] Date of Patent: Oct. 25, 1994

[54] INTEGRATED CIRCUIT WITH LAYOUT EFFECTIVE FOR HIGH-SPEED PROCESSING

[75] Inventors: Tsuneaki Kudou, Kawasaki; Takeji Tokumaru, Yokohama, both of Japan

[73] Assignee: Kabushiki Kaisha Toshiba, Kawasaki, Japan

[21] Appl. No.: 950,731

[22] Filed: Sep. 24, 1992

Related U.S. Application Data

[63] Continuation of Ser. No. 700,939, May 13, 1991, abandoned, which is a continuation of Ser. No. 391,968, Aug. 10, 1989, abandoned.

[30] Foreign Application Priority Data

Aug. 12, 1988 [JP] Japan .................. 63-200202

[51] Int. Cl.5 ............................................ H01L 27/10
[52] U.S. Cl. ...................... 257/211; 257/208; 257/210
[58] Field of Search .............. 357/45 M, 45, 41, 68, 357/40; 365/189, 190; 257/211, 208, 210

[56] References Cited

U.S. PATENT DOCUMENTS

| | | | |
|---|---|---|---|
| 4,541,076 | 9/1985 | Bower et al. | 357/45 |
| 4,760,560 | 6/1988 | Ariizumi et al. | 357/45 |

FOREIGN PATENT DOCUMENTS

| | | | |
|---|---|---|---|
| 57-111045 | 7/1982 | Japan | 357/45 |
| 61-131559 | 6/1986 | Japan | 357/45 |

Primary Examiner—William L. Sikes
Assistant Examiner—Hong-Xuan Dang
Attorney, Agent, or Firm—Foley & Lardner

[57] ABSTRACT

An integrated circuit with circuit layout enabling higher area utilization efficiency and shorter routing lengths, suitable for large-scale integrated, high-speed processing applications. The integrated circuit includes at least one function block for performing desired functions with respect to input data entered in a first direction to produce output data in the first direction; and at least two control blocks for providing control signals for controlling the operations of the function block, in a second direction perpendicular to the first direction, the control blocks being arranged such that the function block is located between two of the control blocks.

3 Claims, 4 Drawing Sheets

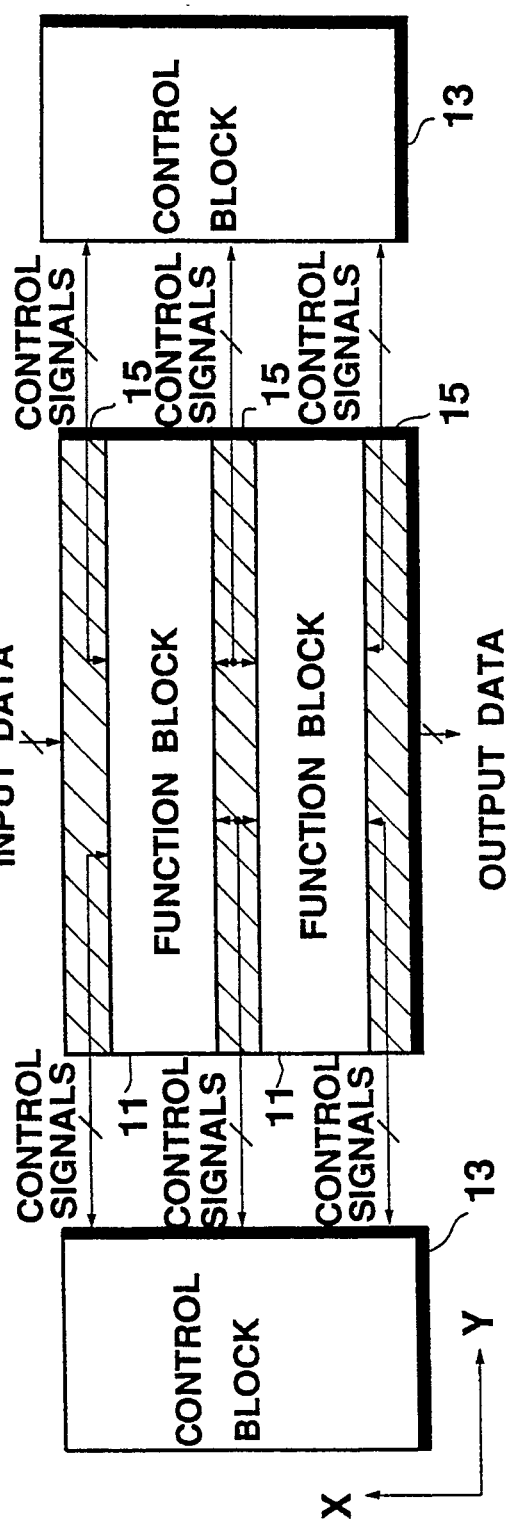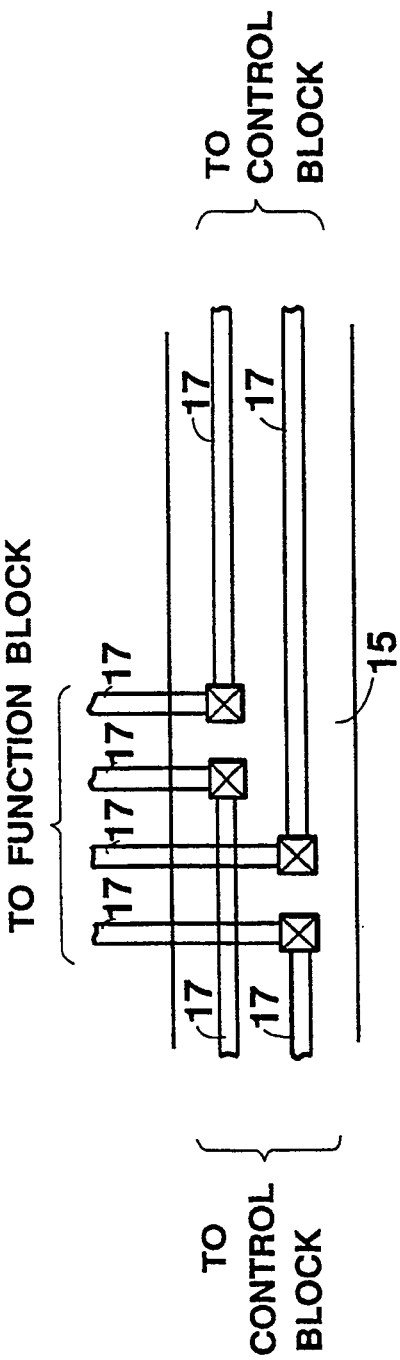

INTEGRATED CIRCUIT WITH LAYOUT EFFECTIVE FOR HIGH-SPEED PROCESSING

This application is a continuation of application Ser. No. 07/700,939, filed May 13, 1991, now abandoned, which is a continuation of application Ser. No. 07/391,968, filed Aug. 10, 1989, now abandoned.

BACKGROUND OF THE INVENTION

1. Field of the Invention

The present invention relates to integrated circuits to be utilized in such products as a semi-custom LSI or a micro-processor, and more particularly, to such integrated circuits particularly suitable for large-scale integrated, high-speed processing applications.

2. Description of the Background Art

The development of high-speed and large-scale integrated circuits prompted more densely laid out integrated circuit designs.

In FIG. 1, one such conventional layout is shown, in which two function blocks 1 capable of performing some required functions are controlled by a control block 3. Each of the function blocks 1 may contain, for example, a arithmetic logic operator circuit or a barrel shifter for a micro-processor. The n bit input data are provided to one of the function blocks 1, and the n bit output data are produced from another one of the function blocks 1, as shown in FIG. 1. In other words, the data are transmitted in the Y-direction.

In such a case, the control signals for controlling the operation of the function blocks 1 from the control block 3 are usually transmitted, in and out of the function blocks 1, in the X-direction, as shown in FIG. 1. Consequently, the control block 3 is usually located in to either the left or the right of the function blocks 1, as in FIG. 1.

Here, the control signals cannot be propagated through the element area in the function block. This is because for transmitting a number of control signals through the element area, as many different types of routings are required.

For this reason, there is usually provided routing areas 5 sandwiching each function block 1 in the Y-direction, as in FIG. 1, through which the control signals are transmitted between the function blocks 1 and the control block 3 by routings 7, as shown in FIG. 2.

This layout, however, necessitates the extension of the routing areas 5 in the Y-direction when the number of routings 7 are to be increased. Since the longer routings 7 (in the Y-direction) are needed for the routing areas 5 extended in the Y-direction, the routing load will also increase in such a case, which can lead to the slowing down of the control signal transmission.

Moreover, when all the routings 7 are to be provided from one control block 3, there appears a dead space in the routing areas 5 at which there are no routings, as in FIG. 2. Obviously, this dead space becomes particularly large when the routing areas 5 are extended in the Y-direction. Thus, when the number of control signals is increased, the efficiency of area utilization is considerably deteriorated.

On the other hand, the control signals usually require buffer circuits because of their large load. When such buffer circuits are not to be incorporated inside either the function blocks 1 or the control block 3, a buffer block 8 is provided between the function blocks 1 and the control block 3, as shown in FIG. 3, where each subdivision inside the buffer block 8 represents one buffer circuit for one control signal, and the buffer block 8 comprises such individual buffer circuits arranged along the Y-direction.

In such a case, the size of the entire integrated circuit in the Y-direction depends on the pitch in the Y-direction between adjacent buffer circuits inside the buffer block 8. In particular, when the number of control signals is increased, a corresponding increase in the number of buffer circuits necessitates the extension in the Y-direction of routing crank areas 9 between the buffer block 8 and the function blocks 1 as well as between the buffer block 8 and the control block 3. This can lead to the appearance of dead blocks 6 below the function blocks 1 and the control block 3, as in FIG. 3. Thus, again, when the number of control signals is increased, the efficiency of area utilization is considerably deteriorated.

SUMMARY OF THE INVENTION

It is therefore an object of the present invention to provide an integrated circuit with a circuit layout enabling higher area utilization efficiency and shorter routing lengths, suitable for large-scale integrated, high-speed processing applications.

This object is achieved in the present invention by providing an integrated circuit, comprising: at least one function block for performing desired functions with respect to input data entered in a first direction to produce output data in the first direction; and at least two control blocks for providing control signals for controlling the operations of the function block, in a second direction perpendicular to the first direction, the control blocks being arranged such that the function block is located between two of the control blocks.

Other features and advantages of the present invention will become apparent from the following description taken in conjunction with the accompanying drawings.

BRIEF DESCRIPTION OF THE DRAWINGS

FIG. 4 is a schematic circuit diagram of one embodiment of an integrated circuit according to the present invention.

FIG. 5 is a schematic circuit diagram of another embodiment of an integrated circuit according to the present invention.

DETAILED DESCRIPTION OF THE PREFERRED EMBODIMENTS

Figure 1:
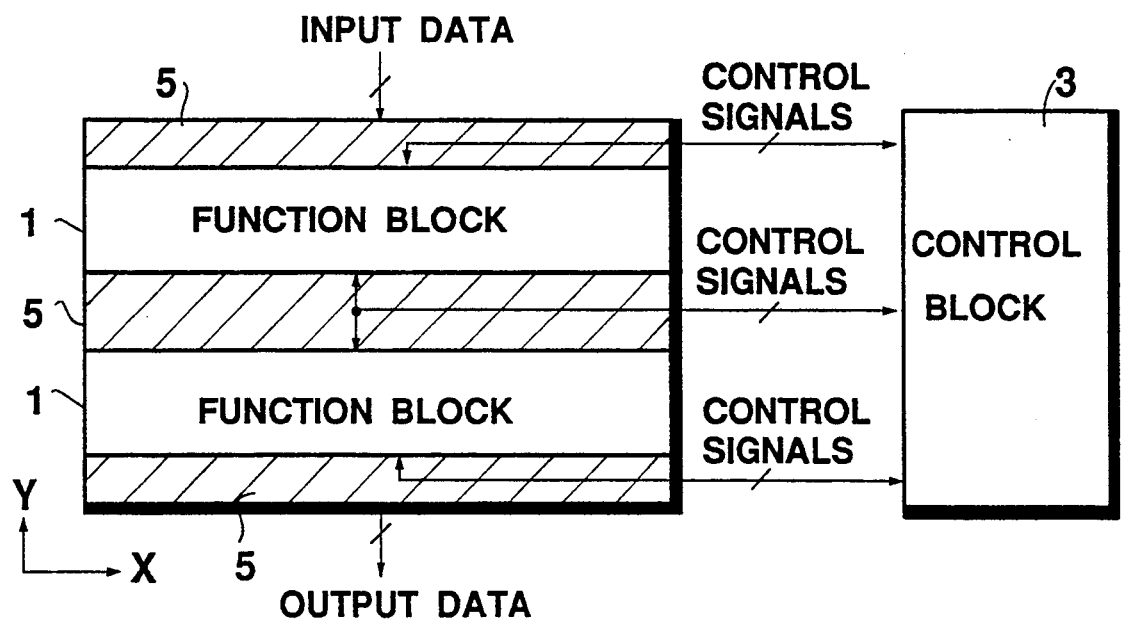
FIG. 1 is a schematic circuit diagram of a conventional integrated circuit.

Referring now to FIG. 4, there is shown one embodiment of an integrated circuit according to the present invention.

In this embodiment, two function blocks 11 capable of performing some required functions are controlled by two control blocks 13. Each of the function blocks 1 may contain, for example, a arithmetic logic operator circuit or a barrel shifter for a micro-processor. The n bit input data are provided to one of the function blocks 1, and the n bit output data are produced from another one of the function blocks 11. Thus, the data are transmitted in the Y-direction.

In order to transmit control signals, for controlling the operations of the function blocks 11, in and out of the function blocks 11, in the X-direction, one of the control blocks 13 is located in the left of the function blocks 11, and the other one of the control blocks 13 is located in the right of the function blocks 11. Each of the control blocks 13 is formed, for example, by automatic placement and routing using standard cells, responsible for a half of the entire control for the function blocks 11, and includes buffer circuits.

There are also provided routing areas 15 sandwiching each of the function blocks 11 in the Y-direction, through which the control signals are transmitted between the function blocks 11 and the control blocks 13 by routings 17, as shown in FIG. 5.

Figure 2:
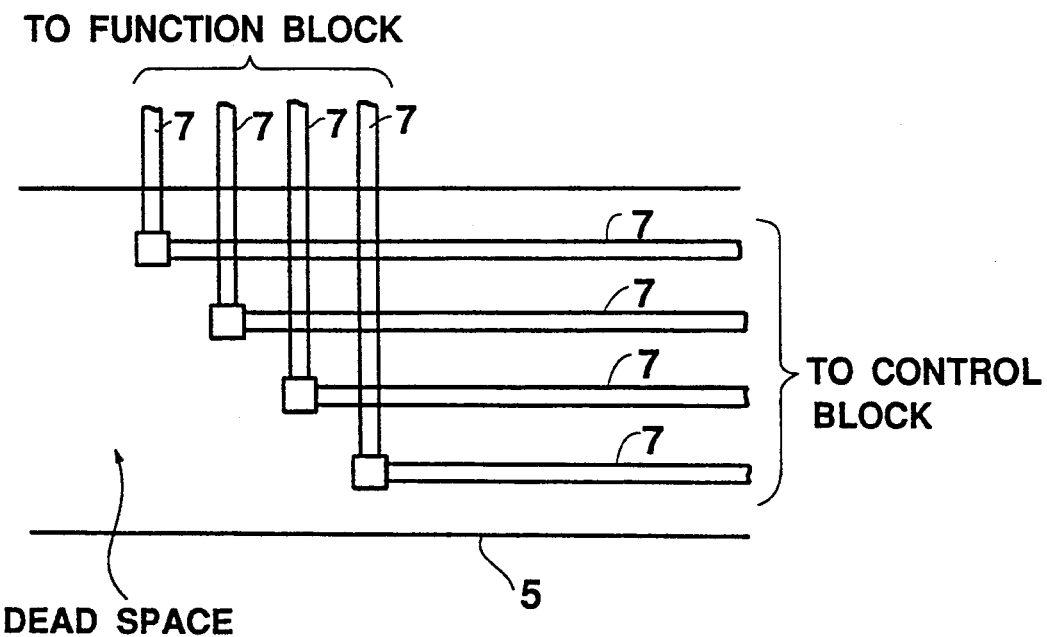
FIG. 2 is an enlarged view of routings inside the routing area of the conventional integrated circuit of FIG. 1.

As can be seen from FIG. 5, the transmission of the control signals from the right and the left of the routing areas 15 enable this embodiment to reduce the size in the Y-direction of the routing areas 15 to a half of that in a conventional case shown in FIG. 2. Namely, in this embodiment, two routings, one from the right and one from the left, can be placed at the same Y-coordinate as in FIG. 5, so that when four routings are involved, four routing lines in the Y-direction are required as in FIG. 2, whereas only two routing lines in each X-direction are required in this embodiment as in FIG. 5.

Moreover, wasteful dead space which appeared in the conventional layout can be eliminated completely in this embodiment. Thus, in this embodiment, the area utilization efficiency can be greatly improved.

It follows that in this embodiment, the lengths of routings 17 can be shorter than the conventional layout, in the X-direction due to the fact that the routings 17 come from both the right and the left, as well as in the Y-direction due to the routing areas 15 which have smaller sizes in the Y-direction than the conventional layout. As a consequence, the routing load can greatly be reduced, so that the transmission of the control signals can be faster, which implies that the operations of the entire integrated circuit can be faster in this embodiment.

Figure 6:
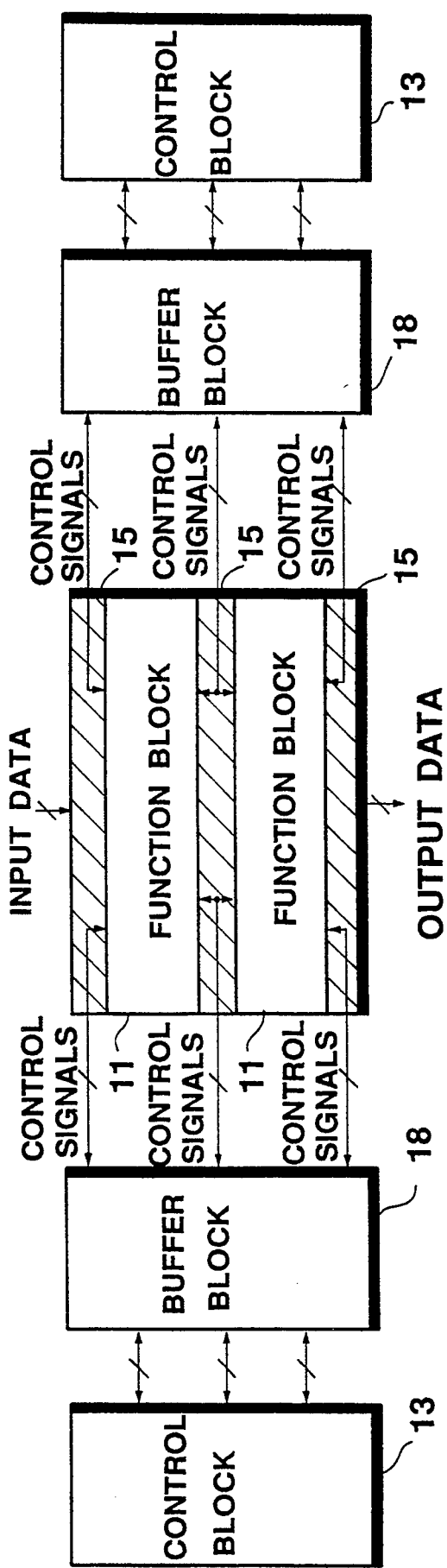
FIG. 6 is an enlarged view of routings inside the routing area of the embodiments of FIGS. 4 and 5.

As an alternative embodiment, FIG. 6 shows an integrated circuit with two buffer blocks 18 provided between the function blocks 11 and the control blocks 13, instead of buffer circuits inside the control blocks 13 in the previous embodiment. The remaining portion of this embodiment is substantially the same as in the previous embodiment.

Figure 3:
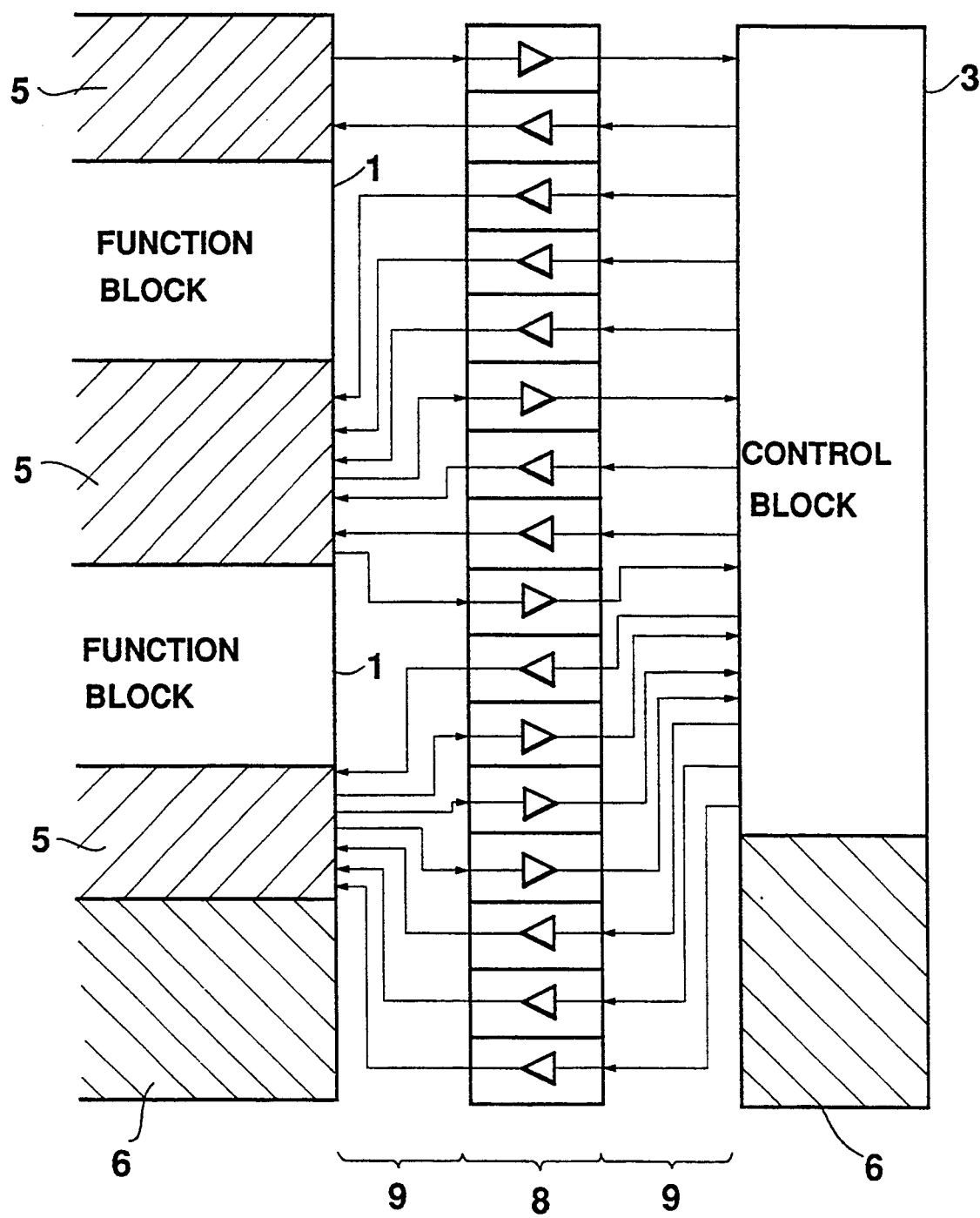
FIG. 3 is a partial schematic circuit diagram of another conventional integrated circuit showing a layout around a buffer block.

Obviously, a similar advantage to that described above for the previous embodiment can be obtained in this embodiment as well. In addition, in this embodiment, the size of the routing crank areas to be provided between the buffer blocks 18 and the function blocks 11 as well as between the buffer blocks 18 and the control blocks 13 can be reduced such that the size of the routing crank areas in the Y-direction can be made to be the same as that of the buffer blocks 18, so that dead blocks appeared below the function blocks and the control block in the conventional layout of FIG. 3 can be eliminated completely in this embodiment. Thus, in this embodiment, the are utilization efficiency can be greatly improved in this respect as well.

Thus, according to the present invention, it is possible to provide integrated circuits with a circuit layout enabling higher area utilization efficiency and shorter routing lengths, suitable for large-scale integrated, high-speed processing applications.

It is to be noted that the role of the X- and Y-directions in the embodiments described above may be reversed, i.e., it is possible to transmit data in the X-direction and control signals in the Y-direction in which case two control blocks can be placed over and below the function blocks, instead of the right and left arrangement in the above embodiments.

Besides this, many modifications and variations of the above embodiments may be made without departing from the novel and advantageous features of the present invention. Accordingly, all such modifications and variations are intended to be included within the scope of the appended claims.

What is claimed is:

1. An integrated circuit, comprising:
    at least one function block for performing a prescribed function with respect to input data entered in a first direction to produce output data in said first direction;
    at least two control blocks for providing control signals for controlling operation of said at least one function block in order to enable said at least one function block to carry out said prescribed function, in a second direction perpendicular to said first direction, said control blocks being arranged such that said at least one function block is located between two of said control blocks, each of said control blocks being an assembly of standard cells;
    routing areas sandwiching said at least one function block in said first direction, in which routings for transmitting said control signals are arranged such that one routing from one of said control blocks and another routing from another of said control blocks are placed on a single straight line in said second direction, wherein a first length of said one routing within one of said routing areas from said one of said control blocks and a second length of said another routing within said one of said routing areas from said another of said control blocks together substantially cover a third length of said single straight line within said one of said routing areas in said second direction; and
    a pair of buffer blocks respectively located between said control blocks and said at least one function block.

2. An integrated circuit comprising:
    a plurality of function blocks arranged to extend in parallel in a given direction, each block of said blocks being constructed to perform a respective function;
    a plurality of routing areas respectively located between said function blocks;
    a pair of control blocks respectively located at opposite ends of said function blocks for supplying control signals to said function blocks in order to enable said function blocks to carry out said respective functions, each of said control blocks being an assembly of standard cells;
    wiring provided for transmitting said control signals from said control blocks to said function blocks and located in said routing areas, said wiring entering said routing areas through opposite ends of said routing areas from said control blocks; and
    a pair of buffer blocks respectively located between said control blocks and said function blocks.

3. An integrated circuit as in claim 2, wherein said wiring for transmitting said control signals is arranged such that one wiring from one of said control blocks is located on a single straight line a given direction, wherein a first length of said one wiring within one of said routing areas from said one of said control blocks and a second length of another wiring within said one of said routing areas from another of said control blocks together substantially cover a third length of said single straight line within said one of said routing areas in said given direction.

* * * * *